United States Patent
Kong

(10) Patent No.: US 7,902,305 B2
(45) Date of Patent: *Mar. 8, 2011

(54) COMPOSITION OF CATIONIC INITIATOR AND OXETANE COMPOUND

(75) Inventor: Shengqian Kong, Edison, NJ (US)

(73) Assignee: Henkel AG & Co. KGaA, Duesseldorf (DE)

( * ) Notice: Subject to any disclaimer, the term of this patent is extended or adjusted under 35 U.S.C. 154(b) by 42 days.

This patent is subject to a terminal disclaimer.

(21) Appl. No.: 12/147,032

(22) Filed: Jun. 26, 2008

(65) Prior Publication Data

US 2008/0272328 A1 Nov. 6, 2008

Related U.S. Application Data

(62) Division of application No. 11/098,116, filed on Apr. 4, 2005, now abandoned.

(51) Int. Cl.
*C08G 65/18* (2006.01)
*C08K 3/36* (2006.01)
*C08L 63/02* (2006.01)
*C08L 71/00* (2006.01)

(52) U.S. Cl. ......... 525/523; 524/612; 525/186; 525/480; 528/417

(58) Field of Classification Search .................. None
See application file for complete search history.

(56) References Cited

U.S. PATENT DOCUMENTS

| | | | | |
|---|---|---|---|---|
| 5,463,084 A | * | 10/1995 | Crivello et al. | 549/214 |
| 2003/0062125 A1 | * | 4/2003 | Takamatsu et al. | 156/327 |
| 2005/0061429 A1 | * | 3/2005 | Hosaka | 156/273.3 |

FOREIGN PATENT DOCUMENTS

JP 2001303015 A * 10/2001

OTHER PUBLICATIONS

Made-in-China.com Product Data Sheet for Photoinitiator ITX, 2-isopropylthioxanthone, 2009, one page.*

* cited by examiner

*Primary Examiner* — Robert Sellers
(74) *Attorney, Agent, or Firm* — Jane E. Gennaro

(57) ABSTRACT

This invention relates to cationically curable sealants that provide low moisture permeability and good adhesive strength after cure. The composition consists essentially of an oxetane compound and a cationic initiator.

6 Claims, 1 Drawing Sheet

PERIMETER SEALED OPTOELECTRONIC DEVICE

US 7,902,305 B2

COMPOSITION OF CATIONIC INITIATOR AND OXETANE COMPOUND

This is a divisional of application Ser. No. 11/098,116, filed Apr. 4, 2005, now abandoned.

This Invention was made with support from the Government of the United States of America under Agreement No. MDA972-93-2-0014 awarded by the Army Research Laboratories. The Government has certain rights in the Invention.

FIELD OF THE INVENTION

This invention relates to barrier sealants, adhesives, encapsulants, and coatings for use in electronic and optoelectronic devices. (As used in this specification and claims, adhesives, sealants, encapsulants, and coatings are similar materials, all having adhesive, sealant, and coating properties and functions. When any one is recited, the others are deemed to be included.)

BACKGROUND

Radiation curable materials have found increased use as coatings, adhesives, and sealants over the past three decades for reasons including low energy consumption during cure, rapid cure speed through either radical or cationic mechanisms, low curing temperature, wide availability of curable materials, and the availability of solvent-free products. These benefits have made such products especially suited for rapidly adhering and sealing electronic and optoelectronic devices that are temperature sensitive or cannot conveniently withstand prolonged curing times. Optoelectronic devices particularly are often thermally sensitive and may need to be optically aligned and spatially immobilized through curing in a very short time period.

Numerous optoelectronic devices are also moisture or oxygen sensitive and need to be protected from exposure during their functional lifetime. A common approach is to seal the device between an impermeable substrate on which it is positioned and an impermeable glass or metal lid, and seal or adhere the perimeter of the lid to the bottom substrate using a radiation curable adhesive or sealant.

A common manifestation of this package geometry is exemplified in FIG. 1, which discloses the use of a radiation curable perimeter sealant (1) to bond a metal or glass lid (2) over an organic light emitting diode (OLED) stack (3) fabricated on a glass substrate (4). Although various configurations exist, a typical device also contains an anode (5), a cathode (6), and some form of electrical interconnect between the OLED pixel/device and external circuitry (7). For the purposes of this invention, no particular device geometry is specified or required aside from one which incorporates an adhesive/sealant material such as a perimeter sealant (1).

In many configurations, as for the example in FIG. 1, both the glass substrate and the metal/glass lid are essentially impermeable to oxygen and moisture, and the sealant is the only material that surrounds the device with any appreciable permeability. For electronic and optoelectronic devices, moisture permeability is very often more critical than oxygen permeability; consequently, the oxygen barrier requirements are much less stringent, and it is the moisture barrier properties of the perimeter sealant that are critical to successful performance of the device.

Good barrier sealants will exhibit low bulk moisture permeability, good adhesion, and strong interfacial adhesive/substrate interactions. If the quality of the substrate to sealant interface is poor, the interface may function as a weak boundary, which allows rapid moisture ingress into the device regardless of the bulk moisture permeability of the sealant. If the interface is at least as continuous as the bulk sealant, then the permeation of moisture typically will be dominated by the bulk moisture permeability of the sealant itself.

It is important to note that one must examine moisture permeability (P) as the measure of effective barrier properties and not merely water vapor transmission rate (WVTR), as the latter is not normalized to a defined path thickness or path length for permeation. Generally, permeability can be defined as WVTR multiplied by unit permeation path length, and is, thus, the preferred way to evaluate whether a sealant is inherently a good barrier material.

The most common ways to express permeability are the permeability coefficient (e.g. g·mil/(100 in$^2$·day·atm)), which applies to any set of experimental conditions, or the permeation coefficient (e.g. g·mil/(100 in$^2$·day) at a given temperature and relative humidity), which must be quoted with the experimental conditions in order to define the partial pressure/concentration of permeant present in the barrier material. In general, the penetration of a permeant through some barrier material (permeability, P) can be described as the product of a diffusion term (D) and a solubility term (S):
$P = DS$ The solubility term reflects the affinity of the barrier for the permeant, and, in relation to water vapor, a low S term is obtained from hydrophobic materials. The diffusion term is a measure of the mobility of a permeant in the barrier matrix and is directly related to material properties of the barrier, such as free volume and molecular mobility. Often, a low D term is obtained from highly crosslinked or crystalline materials (in contrast to less crosslinked or amorphous analogs). Permeability will increase drastically as molecular motion increases (for example as temperature is increased, and particularly when the $T_g$ of a polymer is exceeded).

Logical chemical approaches to producing improved barriers must consider these two fundamental factors (D and S) affecting the permeability of water vapor and oxygen. Superimposed on such chemical factors are physical variables: long permeation pathways and flawless adhesive bondlines (good wetting of the adhesive onto the substrate), which improve barrier performance and should be applied whenever possible. The ideal barrier sealant will exhibit low D and S terms while providing excellent adhesion to all device substrates.

It is not sufficient to have only a low solubility (S) term or only a low diffusivity (D) term in order to obtain high performance barrier materials. A classic example can be found in common siloxane elastomers. Such materials are extremely hydrophobic (low solubility term, S), yet they are quite poor barriers due to their high molecular mobility due to unhindered rotation about the Si—O bonds (which produces a high diffusivity term (D). Thus, many systems that are merely hydrophobic are not good barrier materials despite the fact that they exhibit low moisture solubility. Low moisture solubility must be combined with low molecular mobility and, thus, low permeant mobility or diffusivity.

For liquid materials that are cured to solid sealants, such as the inventive compositions, the attainment of lower molecular mobility within the cured matrix is approached through high crosslink density, microcrystallinity, or close packing of molecular backbones between the crosslinked portions of the matrix.

SUMMARY OF THE INVENTION

Figure 1:
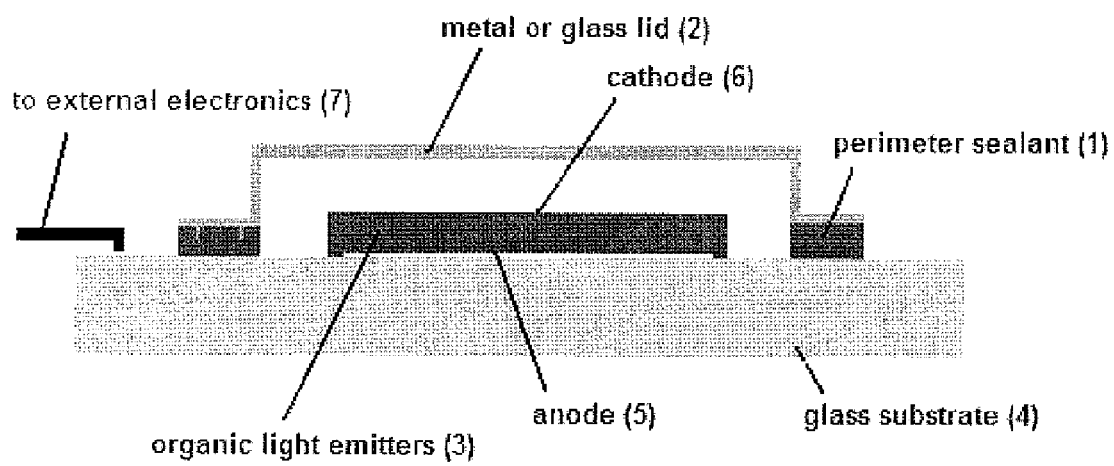
FIG. 1 is a perimeter sealed optoelectronic device.

The inventors have discovered that certain resin and resin/filler systems provide superior barrier performance, particularly to moisture, through the incorporation of an oxetane resin and a cationic initiator into the barrier composition. The oxetane resin in general will have the structure which the oxetane compound has the structure:

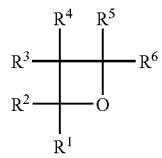

in which $R^1$, $R^2$, $R^3$, $R^4$, $R^5$, $R^6$ are selected from the group consisting hydrogen, and alkyl, haloalkyl, alkoxy, aryloxy, aryl, ester, thio-ester, and sulfide groups. Such barrier materials may be used alone or in combination with other curable resins and various fillers. The resulting compositions exhibit a commercially acceptable cure rate, a balance of high crosslink density and molecular packing (low permeant mobility/diffusivity term, D), hydrophobicity (low water solubility term, S), and adhesion (strong adhesive/substrate interfaces) to make them effective for use in sealing and encapsulating electronic, optoelectronic, and MEMS devices.

DETAILED DESCRIPTION OF THE INVENTION

This invention is a cationically curable barrier sealant consisting essentially of (a) an oxetane compound and (b) a cationic initiator. The barrier adhesive or sealant optionally contains (c) one or more fillers and optionally, (d) one or more adhesion promoters or one or more epoxy resins. When one or more epoxy resins are present, preferably they are selected from the group consisting of bisphenol F diglycidyl ether, resorcinol diglycidyl ether, novolac glycidyl ethers, and halogenated glycidyl ethers, although other epoxies may be used. The use of a cationic photoinitiator results in a radiation-curable formulation; however, the use of a cationic catalyst that can trigger polymerization at room or elevated temperatures may be used for thermal cure. The resulting compositions are suitable for use in sealing and encapsulating electronic and optoelectronic devices.

Within this specification, the term radiation is used to describe actinic electromagnetic radiation. Actinic radiation is defined as electromagnetic radiation that induces a chemical change in a material, and for purposes within this specification will also include electron-beam curing. In most cases electromagnetic radiation with wavelengths in the ultraviolet (UV) and/or visible regions of the spectrum are most useful.

Within this specification, the term oxetane compound refers to any small molecule, oligomer, or polymer carrying an oxetane functionality. The oxetane compound in general will have the structure

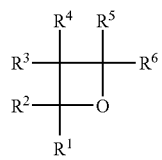

in which $R^1$, $R^2$, $R^3$, $R^4$, $R^5$, and $R^6$ are selected from the group consisting of hydrogen, and alkyl, haloalkyl, alkoxy, aryloxy, aryl, ester, thio-ester, and sulfide groups. In one embodiment, the oxetane compounds are selected from the group of oxetane compounds having the structures:

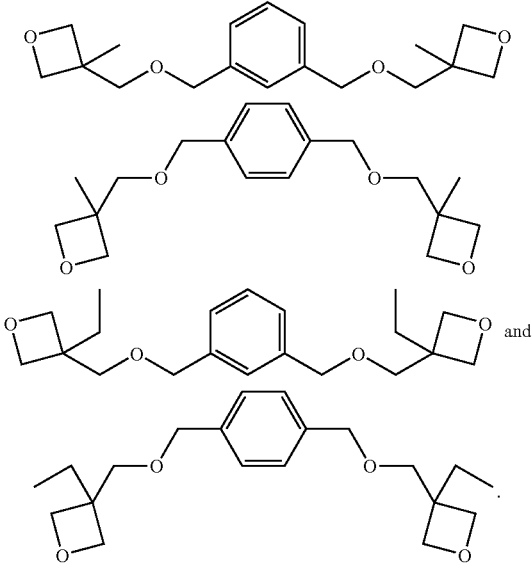

In another embodiment, the oxetane compound will have an aromatic core, onto which aromatic core are substituted in a meta-position with each other, the oxetane functionality and an additional polymerizable functionality. In this embodiment, the oxetane compound will have the structure:

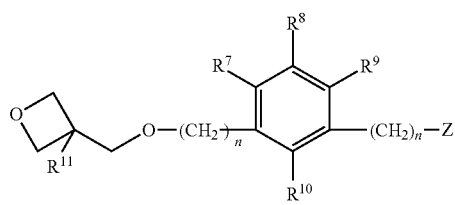

in which $R^7$, $R^8$, $R^9$, $R^{10}$ and $R^{11}$ are independently selected from the group consisting of hydrogen, alkyl, haloalkyl, alkoxy, aryloxy, aryl, alkylol and aryloxyl groups, n is 0, 1, 2, 3, or 4; Z is a cationically reactive functionality selected from the group consisting of, but not limited to:

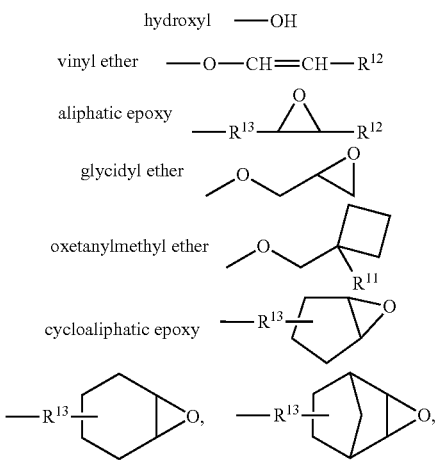

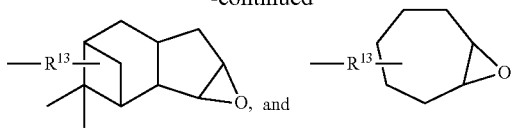

in which $R^{11}$ and $R^{12}$ are independently selected from the group consisting of hydrogen, alkyl, haloalkyl, alkoxy, aryloxy, aryl, alkylol and aryloxyl groups; and $R^{13}$ is a linking group selected from the group consisting of alkyl, haloalkyl, aryl, ether, thio-ether, ester, thio-ester, silane, carbonate, or ketone.

Exemplary oxetane compounds meeting the above description include, but are not limited to,

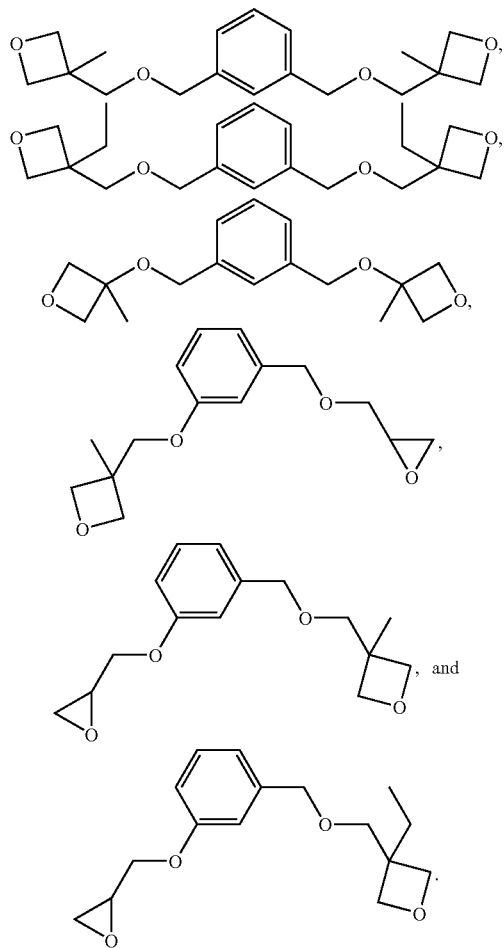

In another embodiment the oxetane compound is a hybrid compound having both oxetane and a second reactive functionality extending from a cycloaliphatic backbone. In general, such compounds will have the structure

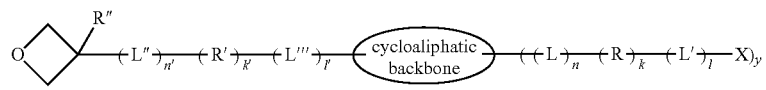

in which L, L', L" and L'" are linking groups independently selected from the group consisting of

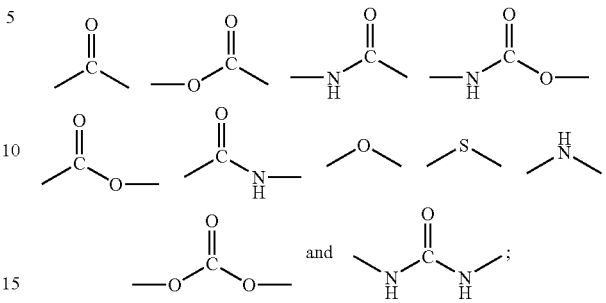

R and R' independently are selected from the group consisting of linear alkyl, branched alkyl, cycloalkyl, aryl, heteroaryl, silane or siloxane groups; R" is independently selected from the group consisting of hydrogen, alkyl, haloalkyl, alkoxy, aryloxy, aryl, alkylol and aryloxyl groups; X is a reactive group independently selected from the group consisting of glycidyl epoxy, aliphatic epoxy, and cycloaliphatic epoxy; oxetane; vinyl, propenyl, crotyl, allyl, and propargyl ether and thio-ethers of those groups; acrylate and methacrylate; itaconate; maleimide; maleate, fumarate, and cinnamate esters; styrenic; acrylamide and methacrylamide; chalcone; thiol; allyl, alkenyl, and cycloalkenyl groups; n, k, l, n', k', and l' are 0 or 1; and y is 1 to 10.

When n, k, and l in the above structures are 0, and X is a form of epoxy, X can be attached to the cycloaliphatic backbone by a direct bond or can be a part of the cycloaliphatic backbone. Exemplary embodiments of the cycloaliphatic hybrid compounds include, but are not limited to,

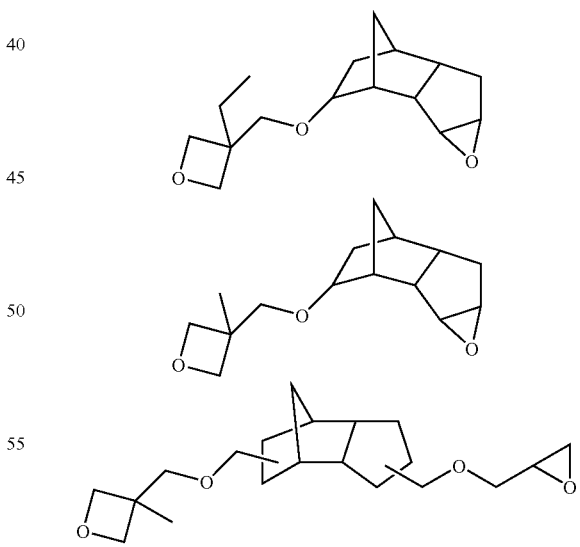

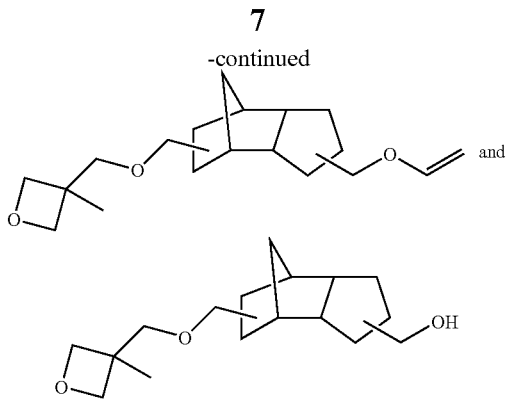

Within this specification, the terms cycloaliphatic or alicyclic refer generally to a class of organic compounds containing carbon and hydrogen atoms joined to form one or more rings, which may contain other atoms, such as, halogens (e.g. Cl, Br, I), substituent atoms (e.g. O, S, N), or substituent groups (e.g. OR, SR, $NR_2$ in which R is a linear or branched alkyl or cycloalkyl or aryl group). In general, cycloaliphatic resins are defined as resins that contain a cyclic carbon-based ring structure in their backbone, which cyclic carbon backbone may have heteroatoms within the backbone or attached to it. It is preferable that the cycloaliphatic resin backbone be composed primarily of carbon, hydrogen and halogen atoms.

The selection of an initiator for the inventive radiation curable barrier materials is familiar to those skilled in the art of radiation curing. For photocuring, the curing initiator be a photoinitiator. The selection of an appropriate photoinitiator is highly dependent on the specific application in which the barrier sealant is to be used. A suitable photoinitiator is one that exhibits a light absorption spectrum that is distinct from that of the resins, fillers, and other additives in the radiation curable system. If the sealant must be cured through a cover or substrate, the photoinitiator will be one capable of absorbing radiation at wavelengths for which the cover or substrate is transparent. For example, if a barrier sealant is to be cured through a sodalime glass coverplate, the photoinitiator must have significant UV absorbance above ca. 320 nm. UV radiation below 320 nm will be absorbed by the sodalime glass coverplate and not reach the photoinitiator. In this example, it would be beneficial to include a photosensitizer with the photoinitiator into the photoinitiating system, to augment the transfer of energy to the photoinitiator.

Exemplary cationic photoinitiators are disclosed in *Ionic Polymerizations and Related processes*, 45-60, 1999, Kluwer Academic Publishers; Netherlands; J. E. Puskas et al. (eds.). Preferred cationic photoinitiators include diaryliodonium salts and triarylsulfonium salts. Well known commercially available examples include UV9380C (GE Silicones), PC2506 (Polyset), SR1012 (Sartomer), Rhodorsil 2074 (Rhodia), and UVI-6974 (Dow). Preferred sensitizers for diaryliodonium salts are isopropylthioxanthone (referred to herein as ITX, often sold as a mixture of 2- and 4-isomers) and 2-chloro-4-propoxythioxanthone. The selection of an efficient cationic photoinitiating system for a particular curing geometry and resin system is known to those skilled in the art of cationic UV curing, and is not limited within the scope of this invention.

Less common initiating systems, such as thermally generated acids are also anticipated in cases where such catalysts, initiators, and curing agents are appropriate. Exemplary catalysts include Brønsted acids, Lewis acids, and latent thermal acid generators. Representative examples of Brønsted and Lewis acids may be found in literature sources such as Smith, M. B. and March, J. in *March's Advanced Organic Chemistry, Reactions, Mechanisms, and Structures*, 5th Edition, 2001, John Wiley & Sons, Inc., New York, N.Y. pp. 327-362. Examples of latent thermal acid generators include, but not limited to, diaryliodonium salts, benzylsulfonium salts, phenacylsulfonium salts, N-benzylpyridinium salts, N-benzylpyrazinium salts, N-benzylammonium salts, phosphonium salts, hydrazinium salts, ammonium borate salts, etc.

Common fillers include, but are not limited to ground quartz, fused silica, amorphous silica, talc, glass beads, graphite, carbon black, alumina, clays, mica, vermiculite, aluminum nitride, and boron nitride. Metal powders and flakes consisting of silver, copper, gold, tin, tin/lead alloys, and other alloys are contemplated. Organic filler powders such as poly(tetrachloroethylene), poly(chlorotrifluoroethylene), and poly(vinylidene chloride) may also be used. Fillers that act as desiccants or oxygen scavengers, including but not limited to, CaO, BaO, $Na_2SO_4$, $CaSO_4$, $MgSO_4$, zeolites, silica gel, $P_2O_5$, $CaCl_2$, and $Al_2O_3$ may also be utilized.

EXAMPLES

Example 1

Synthesis of Oxetane, 3,3'-[1,3-phenylenebis(methyleneoxymethylene)]bis[3-methyl-

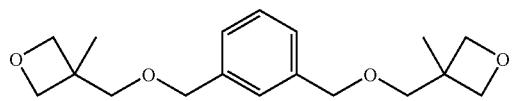

Into a 250 mL three-neck round bottom flask equipped with a reflux condenser a mechanic stirrer were added 12.0 g NaOH (0.3 mol), 0.6 g n-$Bu_4N^+Br^-$ (0.0019 mol), 30.0 g 3-methyl-3-hydroxymethyl-oxetane (0.29 mol), 25.0 g α,α'-dibromo-m-xylene (0.095 mol), and 100 mL of toluene. The reaction was brought to 110° C. for 3.5 hours. The organic phase was collected by filtration and the solvents were removed. The light yellow crude product was redissolved in 200 mL of toluene and washed with deionized water three times. After drying over magnesium sulfate, the toluene solution was passed through a short column of neutral alumina to remove trace amount of the ammonium salt phase transfer catalyst. Finally, the solvents were removed with rotary evaporator and Kugelrohr and the sample was purified by distillation. $^1$H NMR ($CDCl_3$): δppm 1.36 (6H), 3.56 (4H), 4.38-4.55 (8H), 4.60 (4H), 7.18-7.38 (4H).

Example 2

Synthesis of Oxetane, 3,3'-[1,4-phenylenebis(methyleneoxymethylene)]bis[3-methyl-

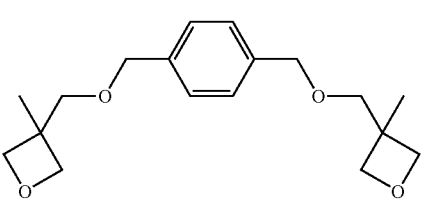

The reaction conditions of Example 1 were adopted except 25.0 g α,α'-dibromo-p-xylene (0.095 mol) was used instead of 25.0 g a, a'-dibromo-m-xylene (0.095 mol). $^1$H NMR (CDCl$_3$): δppm 1.36 (6H), 3.55 (4H), 4.37-4.55 (8H), 4.59 (4H), 7.36 (4H)

Example 3

Synthesis of Oxetane, 3,3'-[1,3-phenylenebis(methyleneoxymethylene)]bis[3-ethyl-

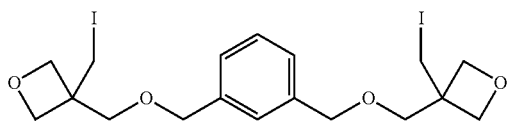

The reaction conditions of Example 1 were adopted except 34.1 g 3-ethyl-3-hydroxymethyl-oxetane (0.29 mol) was used instead of 30.0 g 3-methyl-3-hydroxymethyl-oxetane (0.29 mol). $^1$H NMR (CDCl$_3$): δppm 0.87-0.91 (6H), 1.77-1.83 (4H), 3.61 (4H), 4.40-4.49 (8H), 4.59 (4H), 7.28-7.38 (4H).

Example 4

Synthesis of Oxetane, 3,3'-[1,4-phenylenebis(methyleneoxymethylene)]bis[3-ethyl-

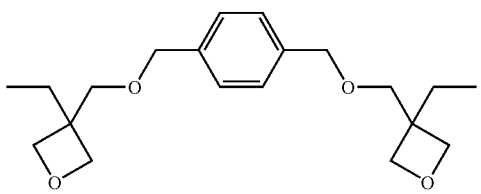

The reaction conditions of Example 3 were adopted except 25.0 g α,α'-dibromo-p-xylene (0.095 mol) was used instead of 25.0 g α,α'-dibromo-m-xylene (0.095 mol). $^1$H NMR (CDCl$_3$): δppm 0.89-0.92 (6H), 1.77-1.83 (4H) 3.61 (4H), 4.40-4.49 (8H), 4.58 (4H), 7.34 (4H).

Example 5

Oxetane-based Barrier Sealant 1

The oxetane from example 3, a photoinitiating system (cationic photoinitiator and ITX) were placed in a plastic jar and mixed with a vortex mixer for one hour until clear. Micron sized silica and a nanosilica rheology modifier were then added to the jar and the whole sample was mixed for another hour with the vortex mixer. The resulting paste was further mixed with a ceramic three-roll mill and degassed in a vacuum chamber. The components and parts by weight are disclosed in Table 1.

TABLE 1

| BARRIER SEALANT # 1 | |
|---|---|
| COMPONENT | PARTS BY WEIGHT |
| Oxetane in Example 3 | 35.3 |
| Photoinitiator | 0.7 |
| ITX | 0.1 |
| Micron sized silica | 63.1 |
| Nanosilica rheology modifier | 0.9 |
| Total: | 100.0 |

After the formulation was thoroughly mixed, 1-2 grams of formulation material were placed on a TEFLON coated aluminum plate. An eight-path variable scraper was used to cast an even thickness of film. The sample was then placed inside a Dymax stationary curing unit and cured for 70 seconds (3.3 J/cm$^2$ UVA) with a medium pressure mercury lamp. Irradiance on the sample surface was measured with a UV Power Puck high energy UV radiometer (EIT Inc., Sterling, Va.) and was found to be 47 (UVA), 32 (UVB), 3 (UVC), 35 (UVV) mW/cm$^2$ respectively. Moisture permeation coefficient (50° C., 100% relative humidity) of the above film was measured with Mocon Permeatran 3/33 and was found to be 3.1 g·mil/100 in$^2$·day.

Adhesion performance was tested by applying two pieces of tape (~5 mils) approximately a quarter of an inch apart on TEFLON coated aluminum plates. Using a blade, the formulation was drawn into a film between the tapes. The glass slides and the dies were wiped clean with isopropanol and sonicated for ten minutes in isopropanol. The slides and dies were removed from the isopropanol and air-dried followed by 5 min UV ozone cleaning. The dies were then placed in the film of formulation and slightly tapped to wet out the entire die. The dies were picked from the formulation coating and placed onto the slides. The dies were slightly tapped to allow the formulation to wet out between the die and the slide. The sealant formulations were cured in a Dymax UV curing unit with 3.3 J/cm$^2$ UVA. The shear adhesion of the cured samples was tested using a Royce Instrument 552 100K equipped with a 100 kg head and a 300 mil die tool. The adhesion was found to be 44.7±1.6 kg.

In another embodiment, the cationically curable barrier composition will further consist essentially of an adhesion promoter, preferably a silane adhesion promoter. The effect of the addition of a silane adhesion promoter was investigated by adding 3.5 wt % Silquest A-186 silane (based on the total formulation) to the formulation in Table 1. Moisture permeation of the cured sample (3.3 J/cm$^2$ UVA) was found to be 3.1 g·mil/100 in$^2$·day and the die shear was 17.0±4.0 kg, sufficient for some commercial applications.

Example 6

Oxetane-based Barrier Sealant 2

Oxetane resins may be combined with platelet fillers such as talc in order to reduce moisture permeability. A formulation was prepared similarly to Example 5. The components and parts by weight are disclosed in Table 2. After curing with 6.0 J/cm$^2$ UVA, the permeation coefficient was 4.2 g·mil/100 in$^2$·day at 50° C., 100% relative humidity.

TABLE 2

BARRIER SEALANT #2

| COMPONENT | PARTS BY WEIGHT |
|---|---|
| Oxetane in Example 3 | 58.8 |
| Photoinitiator | 1.2 |
| ITX | 0.2 |
| Filler: Vertal 410 talc | 39.8 |
| Total: | 100.0 |

Example 7

Synthesis and Performance of an Aromatic Epoxy-Oxetane Hybrid

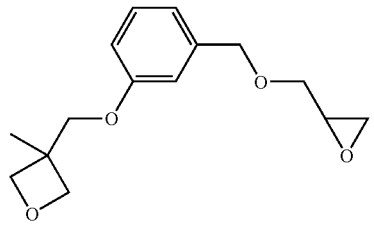

3-Hydroxybenzyl alcohol (24.8 g, 0.2 mol), 3-methyl-3-bromomethyl oxetane (36.3 g, 0.22 mol), potassium carbonate fine powder (30.4 g, 0.22 mol), and 200 mL methyl ethyl ketone were combined in a four neck, 1000 mL round bottom flask equipped with a condenser and mechanical stirrer. The reaction was heated to 65° C. in an oil bath with stirring, and heating and stirring were continued for a total of five days. The solid was filtered off and the liquid portion was washed with 3% aqueous NaOH solution followed by water. Solvent removal by rotary evaporator gave a low viscosity liquid.

This liquid (40.0 g, 0.19 mol) was combined with allyl bromide (36.3 g, 0.3 mol), NaOH (12.0 g, 0.3 mol), tetrabutylammonium bromide (0.82 g, 0.0025 mol), and 100 mL toluene in a four-neck, 1000 mL round bottom flask equipped with a mechanical stirrer and condenser. The reaction was heated to 65° C. with stirring, and the color changed from brown to orange within ten minutes. Heating and stirring were continued overnight. Finally, the solid was filtered off and toluene was removed to give the allylated oxetane product, which was purified by vacuum distillation.

Epoxidation of the allylated oxetane was conducted by combining 17.5 g (0.1 mol) of 3-chloroperoxybenzoic acid in 225 mL of dichloromethane in a four-neck, 500 mL round bottom flask equipped with a mechanical stirrer and thermometer. The flask was chilled to 0° C. in an ice/water bath, and 20.5 g of the above allylated oxetane product dissolved in 50 mL of $CH_2Cl_2$ was added dropwise over 2.5 hours. The flask was warmed to room temperature one hour later, and stirring continued for three days. The solid was filtered off to obtain a clear, orange liquid. The $CH_2Cl_2$ solution was washed with saturated $NaHCO_3$ solution in water and then three times with water.

The organic layer was collected and dried over sodium sulfate. The $CH_2Cl_2$ was removed by rotary evaporation. Purification by vacuum distillation gave 1.5 g of pure hybrid epoxy-oxetane product at 155° C./147 micron. This product was a clear, colorless liquid. $^1H$ NMR ($CDCl_3$): δppm 1.45 (3H), 2.61-2.82 (2H), 3.19 (1H), 3.43-3.80 (2H), 4.04 (2H), 4.45 (2H), 4.46-4.58 (2H), 4.62-4.64 (2H), 6.86-6.95 (3H), 7.25-7.29 (1H). This product was mixed with a photoinitiating system (2.0 wt % cationic photoinitiator SR1012 and 0.12% ITX) and cured with 3.3 $J/cm^2$ UVA. Permeation of the cured film was 6.3 g·mil/100 $in^2$·day at 50° C., 100% relative humidity.

Example 8

Synthesis and Performance of a Cycloaliphatic Epoxy-Oxetane Hybrid

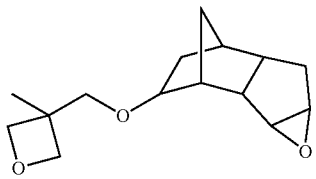

A four-neck, 500 mL round bottom flask equipped with mechanical stirrer and condenser was charged with 150.0 g (0.2 mol) hydroxycyclopentadiene (TCI America), 165.0 g (0.24 mol) 3-methyl-3-bromomethyl oxetane (Chemada), 9.6 g (0.24 mol) sodium hydroxide, 0.64 g (1.0 mol %) tetrabutylammonium bromide (TBAB), and 100 mL toluene. The reaction mixture was heated at 80° C. in an oil bath for two hours, and the temperature was then increased to 110° C. for 24 hours. An additional 26.4 g (0.16 mol) 3-methyl-3-bromomethyl oxetane, 6.4 g (0.16 mol) sodium hydroxide, and 0.64 g TBAB were added and stirring continued for 24 hours. The mixture was filtered and toluene was removed by rotary evaporation, and the oxetane product was separated by vacuum distillation.

Next, 13.8 g (0.061 mol) of 77% m-chloroperoxybenzoic acid (mCPBA) and 200 mL dichloromethane were combined to form a 0.4 M solution in a 500 mL round bottom flask equipped with mechanical stirrer and thermometer, and chilled to 0° C. in an ice/water bath. Using an additional funnel, 12.3 g (0.0525 mol) above oxetane product dissolved in 65 mL dichloromethane was added dropwise to the mCPBA solution over 1.5 hours. The mixture was warmed to room temperature and allowed to stir for another 24 hours.

After the reaction, the mixture was filtered, and the dichloromethane solution was washed with 70 mL saturated $NaHCO_3$ solution, and then with 70 mL water three times. The organic layer was collected and dried over sodium sulfate, and the dichloromethane was removed by rotary evaporation. Vacuum distillation gave the desired product as a colorless liquid in 10.5% yield. $^1H$ NMR ($CDCl_3$): δppm 1.29 (3H), 1.27-2.32 (11H), 3.24-3.41 (2H), 3.43-3.50 (2H), 4.32-4.34 (2H), 4.46-4.50 (2H). The resin was combined with a photoinitiating system (2.0 wt % cationic photoinitiator SR1012 and 0.24 wt % ITX). The formulation cured well and the moisture permeation coefficient was 6.6 mil·g/100 $in^2$·day at 50° C., 100% relative humidity.

Example 9

Effect of Aromatic Substitution on Permeation Coefficient

The oxetanes in Examples 1 to 4 were each blended with a photoinitiating system (2 wt % photoinitiator GE 9380C) and cured with 6.0 $J/cm^2$ UVA followed by annealing at 175° C. for one hour. The permeation coefficient of the cured films were measured and are reported in Table 3. As the data indicate, the meta-substituted oxetanes in examples 1 and 3 are better moisture barrier materials than their para-substituted counterparts, examples 2 and 4.

The permeation coefficient of a 50/50 (wt/wt) solution of the oxetane in example 3 and an aromatic epoxy (EPON 862) using a photoinitiating system of 2 wt % cationic photoinitiator (UV 9380C) was compared with the permeation coefficient of the oxetane in example 4. Again, the meta-substituted oxetane formulation resulted in lower permeation coefficient. As shown in table 3, one may also tailor the moisture barrier performance of the cured samples by choosing different epoxies.

In the following formulations brominated BPADGE is brominated bisphenol A diglycidyl ether and has the structure:

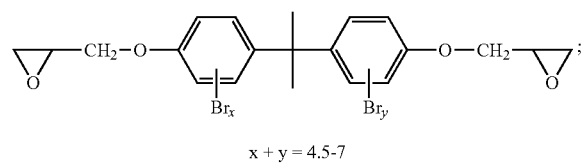

x + y = 4.5-7

EPON 862 has the structure:

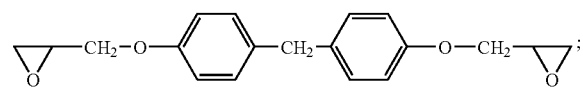

EPON 828 has the structure

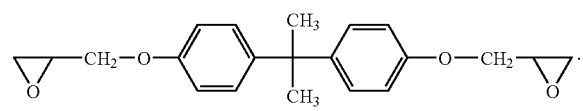

TABLE 3

PERMEATION COEFFICIENT
(g · mil/100 in² · day at 50° C., 100% relative humidity)
OF VARIOUS FORMULATIONS

| OXETANE | BY ITSELF | 50/50 (WT) WITH EPON 862 | 50/50 (WT) WITH EPON 828 | 50/50 (WT) WITH BROMINATED BPADGE |
|---|---|---|---|---|
| Oxetane in example 1 | 7.0 | — | — | — |
| Oxetane in example 2 | 9.4 | — | — | — |
| Oxetane in example 3 | 5.9 | 6.2 | — | — |
| Oxetane in example 4 | 9.5 | 10.5 | 11.0 | 9.1 |

Example 10

Oxetane/Epoxy Blends with Various Fillers

In this example, epoxy/oxetane formulations with different fillers were tested and compared. The results are reported in Table 4 and indicate that, in general, platy fillers such as talc work better at reducing moisture permeation (formulations A, B, C in table 4) than nanosilica fillers (formulation D), on an equal weight basis. The results further indicate that aromatic epoxy EPON 862 in formulation D is a better barrier material than aromatic epoxy EPON 828 in formulation E, when used in cationic UV curable systems. It is also possible to use both talc and silica as fillers for better barrier performance as shown in formulations F and G. No difference in permeation was observed when nanosilica filler was replaced with micron sized silica.

TABLE 4

PERMEATION COEFFICIENTS OF
OXETANE/EPOXY BLENDS WITH VARIOUS FILLERS

| COMPONENTS | A | B | C | D | E | F | G |
|---|---|---|---|---|---|---|---|
| Oxetane in example 3 | | | | | | 24.7 | 24.7 |
| Oxetane in example 4 | 32.9 | 32.9 | 32.9 | 32.9 | 32.9 | | |
| Aromatic epoxy Epon 862 | 32.9 | 32.9 | 32.9 | 32.9 | | 24.7 | 24.7 |
| Aromatic epoxy EPON 828 | | | | | 32.9 | | |
| Cationic photoinitiator SR1012 | | | | | | 1.0 | 1.0 |
| Cationic photoinitiator UV 9380C | 1.3 | 1.3 | 1.3 | 1.3 | 1.3 | | |
| Photosensitizer ITX | | | | | | 0.1 | 0.1 |
| Filler Vertal 7 talc | 32.9 | | | | | | |
| Filler FDC talc | | 32.9 | | | | | |
| Filler Mistrofil P403 talc | | | 32.9 | | | 33.0 | 33.0 |
| Filler Nanosilica | | | | 32.9 | 32.9 | 16.5 | |
| Filler Micron sized silica | | | | | | | 16.5 |
| Total | 100.0 | 100.0 | 100.0 | 100.0 | 100.0 | 100.0 | 100.0 |
| Permeation Coefficient g · mil/100 in² · day at 50° C., 100% RH | 5.7 | 9.3 | 5.4 | 7.7 | 8.8 | 3.5 | 3.5 |

Example 11

Oxetane/Vinyl Ether Formulation

Oxetanes may be blended with diluents, such as vinyl ethers, in UV curable cationic formulations. In this example, a cycloaliphatic vinyl ether (CAVE) having the below structure was used as a reactive diluent and the resulting formulation exhibited a very low moisture permeation coefficient. The formulation and results are reported in Table 5.

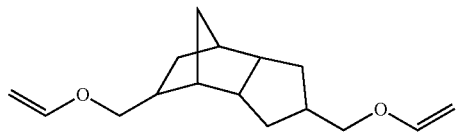

TABLE 5

PERMEATION COEFFICIENT OF
OXETANE/VINYL ETHER FORMULATION

| COMPONENTS | PARTS BY WEIGHT |
|---|---|
| Oxetane in example 3 | 17.5 |
| CAVE | 11.7 |
| Photoinitiator (GE9380C) | 0.87 |

TABLE 5-continued

PERMEATION COEFFICIENT OF
OXETANE/VINYL ETHER FORMULATION

| COMPONENTS | PARTS BY WEIGHT |
|---|---|
| Photosensitizer (ITX) | 0.045 |
| Micron sized silica | 69.9 |
| Total | 100.0 |
| Viscosity (cP) | |
| 10 rpm | 6,676 |
| 1 rpm | 9,420 |
| Permeation Coefficient | 2.8 |
| g · mil/100 in$^2$ · day at | (3 J/cm$^2$ UVA) |
| 50° C., 100% RH | |

Example 12

Oxetane/Epoxy Blends with Different Additives

Oxetane/epoxy resin mixtures may also be blended with diluents, such as vinyl ethers or alcohols in UV curable cationic formulations. The formulation and results are reported in Table 6. Cure speed was measured with a Perkin Elmer Differential Scanning Calorimetry 7 equipped with a UV light source.

TABLE 6

OXETANE/EPOXY BLENDS WITH DIFFERENT ADDITIVES

| COMPONENTS | PARTS BY WEIGHT | | |
|---|---|---|---|
| Oxetane in example 3 | 4.0 | 4.0 | 4.0 |
| Aromatic epoxy EPON 862 | 4.0 | 4.0 | 4.0 |
| Cationic Photoinitiator SR1012 | 0.16 | 0.16 | 0.16 |
| CAVE | | 0.82 | |
| Tricyclodecane dimethanol (Aldrich) | | | 0.82 |
| Curing Speed | Excellent | Excellent | Fair |
| Time to Peak Exotherm (min) | 0.13 | 0.12 | 0.78 |
| Time to 90% Total Exotherm (min) | 0.69 | 0.69 | 1.78 |
| ΔH (J/g) | 294 | 271 | 328 |
| Permeation Coefficient | 6.3 | 6.4 | 7.2 |
| g · mil/100 in$^2$ · day at | | | |
| 50° C., 100% RH | | | |
| (cured with 3 J/cm$^2$ UVA) | | | |

Example 13

Properties and Performances of Oxetane/Epoxy/Talc Formulations with Various Oxetane/Epoxy Ratios UV cure speed and the reactivity of a perimeter sealant is critical to production throughput, and the minimization of thermal processing is generally required for many display applications. UV curing kinetics and thermodynamics can be measured using differential photocalorimetry ("photo DSC"). The cure speed for a series of oxetane/epoxy/talc formulations with various oxetane/epoxy ratios are reported in Table 7, Differential photocalorimetry was performed on the samples using a Perkin-Elmer Differential Scanning Calorimeter 7 equipped with a Hg-arc lamp UV light source. All samples were cured through an indium/tin oxide (ITO)-coated sodalime glass.

Each of the resin combinations contains oxetane (OXT-121, Toagosei), EPON 862 aromatic epoxy, 35 wt % talc (Mistrofil P403 talc), and a photoinitiating system of 2.0 wt % cationic photoinitiator (SR1012), and 0.21 wt % ITX (all based on total weight). For each barrier sealant, the time from UV initiation to maximum curing exotherm was recorded, as well as the time taken to reach 90% of the observed UV curing exotherm. Shorter time to peak and time to 90% conversion are indications of good curing performance.

As the table indicates, good curing performance and good die shear adhesion were observed for formulations K, L, M where the oxetane/epoxy ratio ranged from 75:25 to 25:75. Most significantly, the fastest UV cure speed came from a 50:50 mole ratio of the oxetane and epoxy, which has the sharpest and narrowest exothermic peak. In addition, die shear adhesion of the oxetane rich (H, I) formulations were found to be better than epoxy rich (M, N) formulations.

TABLE 7

PROPERTIES AND PERFORMANCES OF OXETANE/EPOXY/TALC
FORMULATIONS WITH VARIOUS OXETANE/EPOXY RATIOS

| Formula | OXT 121:EPON 862 (mole) | Viscosity (cPs) | | Cure Speed (min) | | Die shear Adhesion (kg) |
|---|---|---|---|---|---|---|
| | | 1.0 rpm | 10.0 rpm | Time to Peak | Time to 90% | |
| H | 100:0 | 2,867 | 1,597 | 0.43 | 3.92 | 40.9 |
| I | 95:5 | 4,096 | 2,252 | 0.27 | 4.44 | 40.9 |
| J | 75:25 | 8,601 | 4,198 | 0.17 | 0.93 | 45.2 |
| K | 50:50 | 7,987 | 4,301 | 0.12 | 0.70 | 44.4 |
| L | 25:75 | 11,870 | 6,553 | 0.13 | 1.73 | 44.2 |
| M | 5:95 | 15,560 | 9,093 | 0.15 | 2.04 | 33.1 |
| N | 0:100 | 18,020 | 10,420 | 0.20 | 2.34 | 35.5 |

Example 14

Permeability of Oxetane/Epoxy Blends with Various Photoinitiators

Several cationic photoinitiators were used to cure 50/50 (by weight) blends of OXT-121 oxetane and EPON 862 epoxy. The results are reported in Table 8 and indicate there is little difference in the permeabilities obtained using these different photoinitiators. The loading of the photoinitiators were normalized so that equal molar amounts of the active catalyst were used. The sulfonium salt catalyst is proprietary to National Starch and Chemical Company.

TABLE 8

PERMEABILITY OF OXETANE/EPOXY BLENDS WITH VARIOUS
PHOTOINITIATORS

| FORMULA | PHOTOINITIATOR | | LOADING (WT %) | PERMEATION (g · mil/100 in$^2$ · day) |
|---|---|---|---|---|
| O | solid iodonium salt | SR1012 | 1.0 | 10.1 |
| P | solid iodonium salt with a sensitizer | SR1012 perylene | 1.0 0.1 | 10.3 |
| Q | sulfonium salt | proprietary | 1.1 | 9.9 |
| R | liquid iodonium salt I | UV 9380C | 2.0 | 9.1 |

Different levels of photoinitiator SR 1012 were also explored using 50/50 (by weight) blends of OXT-121 oxetane and EPON 862 epoxy and the results are reported in Table 9. Within experimental error, the change in the photoinitiator level did not show significant impact on the moisture permeation performance of the sealant. This clearly demonstrates that the barrier performance of the sealants is mostly dominated by the choice of resins and less affected by ways of curing.

TABLE 9

VARIATIONS IN PHOTOINITIATOR LEVEL

| PHOTOINITIATOR LOADING (WT %) | PERMEATION (g · mil/100 in² · day) |
|---|---|
| 0.25 | 9.6 |
| 0.50 | 9.3 |
| 1.00 | 10.1 |
| 2.00 | 9.7 |
| 3.00 | 10.1 |

Example 15

Curing of Oxetane/Epoxy Blends by Heat

A series of oxetane (OXT-121) and epoxy (EPON 862) resin blends were prepared and cured by heat. The oxetane and epoxy blends at different weight ratios were polymerized using DSC ramp from room temperature to 300° C. at 10° C./min. Each sample contained 2.0% cationic photoinitiator (SR1012). The onset, peak temperatures and total heat of polymerization are reported in Table 10.

TABLE 10

CURING OF OXETANE/EPOXY BLENDS BY HEAT

| | RATIO OXETANE:EPOXY | | | | |
|---|---|---|---|---|---|
| | 100:0 | 67:33 | 50:50 | 33:67 | 0:100 |
| ONSET (° C.) | 138 | 135 | 133 | 138 | 171 |
| PEAK (° C.) | 158 | 153 | 158 | 203 | 214 |
| ΔH (J/G) | 627 | 724 | 681 | 637 | 646 |

What is claimed:

1. A cationically curable barrier composition consisting essentially of
   (a) an oxetane compound;
   (b) a cationic initiator,
   (c) one or more fillers, and
   (d) one or more adhesion promoters, or one or more epoxy resins;
   wherein said oxetane compound has the structure:

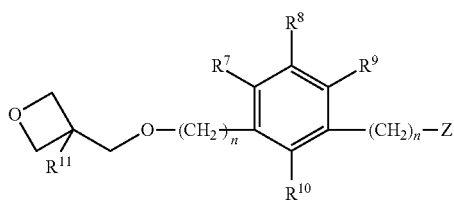

in which
   $R^7$, $R^8$, $R^9$, $R^{10}$, and $R^{11}$ are independently selected from the group consisting of hydrogen, alkyl, haloalkyl, alkoxy, aryloxy, aryl, alkyloyl and aryloyl groups;

n is 0, 1, 2, 3, or 4;
Z is a cationically reactive functionality selected from the group consisting of

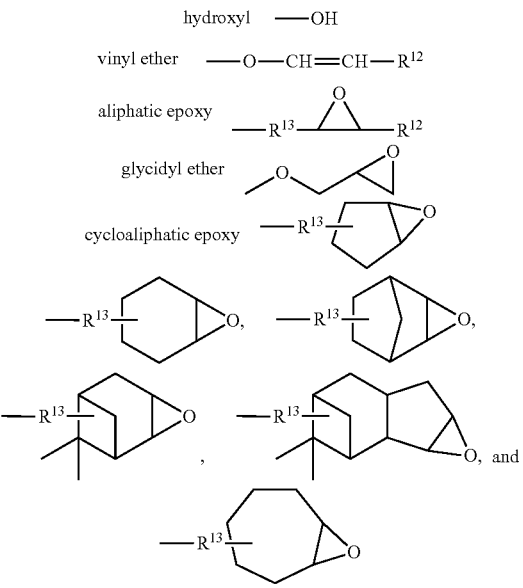

in which
   $R^{12}$ is independently selected from the group consisting of hydrogen, alkyl, haloalkyl, alkoxy, aryloxy, aryl, alkyloyl and aryloyl groups; and
   $R^{13}$ is a linking group selected from the group consisting of alkyl, haloalkyl, aryl, ether, thio-ether, ester, thio-ester, silane, carbonate, and ketone.

2. The cationically curable barrier composition in accordance with claim 1, wherein the cationic initiator is the cationically curable barrier composition in accordance with claim 1, wherein the cationic initiator is selected from the group consisting of diaryliodonium salts, triarylsulfonium salts benzylsulfonium salts, phenacylsulfonium salts, N-benzylpyridinium salts, N-benzylpryazinium salts, N-benzylammonium salts, phosphonium salts, hydrazinium salts, and ammonium borate salts.

3. The cationically curable barrier composition in accordance with claim 2, wherein the cationic initiator is selected from the group consisting of diaryliodonium salts and triarylsulfonium salts.

4. The cationically curable barrier composition in accordance with claim 1 in which one or more fillers are present and are selected from the group consisting of ground quartz, fused silica, amorphous silica, talc, glass beads, graphite, carbon black, alumina, clays, mica, vermiculite, aluminum nitride, boron nitride; silver, copper, gold, tin, tin/lead alloys, poly(tetrachloroethylene), poly(chlorotriflouroethylene), poly(vinylidene chloride), CaO, BaO, $Na_2SO_4$, $CaSO_4$, $MgSO_4$, zeolites, silica gel, $P_2O_5$, $CaCl_2$, and $Al_2O_3$.

5. The cationically curable barrier composition in accordance of claim 1 in which adhesion promoter is not present, and one or more epoxy resins are present and are selected from the group consisting of bisphenol F diglycidyl ether, resorcinol diglycidyl ether, novolac glycidyl ethers, and halogenated glycidyl ethers.

6. The cationically curable barrier composition in accordance with claim 1 in which epoxy resin is not present, and one or more adhesion promoters are present and the promoter is a silane.

* * * * *